US008441772B2

United States Patent
Yoshikawa et al.

(10) Patent No.: US 8,441,772 B2
(45) Date of Patent: May 14, 2013

(54) SUBSTRATE FOR ELECTROSTATIC CHUCK AND ELECTROSTATIC CHUCK

(75) Inventors: Tadayoshi Yoshikawa, Nagano (JP); Koki Tamagawa, Nagano (JP); Naoto Watanabe, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 278 days.

(21) Appl. No.: 12/910,493

(22) Filed: Oct. 22, 2010

(65) Prior Publication Data

US 2011/0096461 A1    Apr. 28, 2011

(30) Foreign Application Priority Data

Oct. 26, 2009  (JP) ................. 2009-245268
Sep. 16, 2010  (JP) ................. 2010-207515

(51) Int. Cl.
| | |
|---|---|
| *H01L 21/683* | (2006.01) |
| *H01T 23/00* | (2006.01) |
| *H01G 7/02* | (2006.01) |
| *H05F 3/00* | (2006.01) |
| *G03G 15/02* | (2006.01) |

(52) U.S. Cl.
USPC ................. 361/234; 361/233; 361/235

(58) Field of Classification Search ............. 361/56, 361/234, 233, 235

See application file for complete search history.

(56) References Cited

U.S. PATENT DOCUMENTS 6,088,213 A  *  7/2000  Herchen ................ 361/234
6,273,958 B2 *  8/2001  Shamouilian et al. ....... 118/728

FOREIGN PATENT DOCUMENTS

JP    2651597 B2    9/1997
JP    2003-133398 A1    5/2003

* cited by examiner

*Primary Examiner* — Jared Fureman
*Assistant Examiner* — Lucy Thomas
(74) *Attorney, Agent, or Firm* — Kratz, Quintos & Hanson, LLP

(57) ABSTRACT

An electrostatic chuck includes a metal base member and an insulating substrate having an opposite surface to an attraction surface joined onto the base member via an adhesive layer. In the substrate, an electrode layer to which a direct current voltage for attraction is applied is embedded in a portion of the substrate, close to the attraction surface. In addition, a plurality of independent RF electrode layers to which different radio frequencies for plasma control are fed, respectively, are embedded in portions of the substrate, at an opposite side of the first electrode layer to the attraction surface. The RF electrode layers are arranged separately in different layers which are not on an identical plane in such a manner as to partially overlap each other in a plan view.

10 Claims, 9 Drawing Sheets

SUBSTRATE FOR ELECTROSTATIC CHUCK AND ELECTROSTATIC CHUCK

CROSS-REFERENCE TO RELATED APPLICATIONS

This application is based upon and claims the benefit of priority of the prior Japanese Patent Application No. 2009-245268, filed on Oct. 26, 2009, and the Japanese Patent Application No. 2010-207515, filed on Sep. 16, 2010, the entire contents of which are incorporated herein by reference.

FIELD

The embodiments discussed herein are related to a substrate for electrostatic chuck and an electrostatic chuck adapted to hold a process target in various types of process apparatuses.

BACKGROUND

Apparatuses using plasma, such as a dry etching apparatus, a CVD apparatus, a PVD apparatus, and the like, use not only radio-frequency waves for plasma generation, but also bias frequencies for controlling the generated plasma by giving energy thereto (radio-frequency waves for plasma control). In current techniques, a plurality of bias frequencies are superimposed and applied to an electrostatic chuck, thereby individually controlling multiple flux energies of ions or electrons in the plasma state.

As a technique related to such a conventional art, there is known a device and a method in which an etching process target attracted to an electrostatic chuck to which a DC voltage is applied between at least paired flat electrodes embedded in an insulating layer is etched in a plasma generated by application of a radio-frequency voltage (Japanese Patent No. 2,651,597). As another technique, there is known a double-electrode wafer holder in which the radial profile of a plasma density on a wafer is improved (Japanese Laid-open Patent Publication No. 2003-133398).

In a dry etching apparatus or the like using plasma, when radio-frequency waves are fed simultaneously to portions having an electrical potential relative to ground, the density of in-plane ion energy generated by the application of the radio-frequency waves is automatically determined by such an influence as the skin effect corresponding to the radio-frequency waves applied or by the configuration of the electrostatic chuck. When the in-plane (e.g., a center portion and a periphery portion of a wafer) control is performed individually as independent distribution control (IDC) does, a frequency and an output need to be selected appropriately. However, such selection is quite difficult, making the in-plane distribution control also difficult.

For example, as is exemplified in FIG. 1A to be described later, in a mode where radio-frequencies for plasma control (RF1, RF2) are simultaneously applied to a base plate 1, the in-plate density distribution (i.e., the density distribution of ion energy on the wafer for performing a process such as etching) is determined by the skin effect corresponding to the frequency applied or the shape of the base plate 1. For this reason, there is a problem that efficient, flexible control of the density distribution is difficult to achieve. The ion energy density in an outer periphery portion of the wafer particularly varies widely, resulting in variations in how the wafer is processed through etching or the like, compared to other portions.

In addition, since the radio-frequency (RF1, RF2) powers fed to the base plate 1 control the plasma by being propagated through an electrostatic chuck substrate 3, the thicker the substrate 3, the more power loss occurs. Accordingly, radio-frequency powers more than required for plasma control has to be fed to the base plate 1.

On the other hand, another problem arises if the thickness of the electrostatic chuck substrate 3 is reduced to make the power loss small. Specifically, when the electrostatic chuck substrate 3 is made thin, an adhesive layer 5 fixedly holding the electrostatic chuck substrate 3 to the base plate 1 is to be located in a relatively upper portion of the electrostatic chuck, which makes the adhesive layer 5 more likely to be exposed to plasma or gas.

Since a material constituting the adhesive layer 5 is less durable to the plasma and the like than that of the electrostatic chuck substrate 3 and is easily damaged, the adhesive layer 5 is therefore easily deteriorated. Accordingly, when the adhesive layer 5 deteriorates, insulation and adhesion effects between the electrostatic chuck substrate 3 and the base plate 1 are lost. As a result, there is a problem of a reduction in the overall life of the electrostatic chuck.

As exemplified in FIG. 1B to be described later, such a problem may occur similarly in a mode in which not only a DC voltage for attraction but also radio-frequency waves (RF1, RF2) for plasma control are applied simultaneously to an electrostatic-attraction electrode layer 4a.

SUMMARY

According to one aspect of the invention, there is provided a substrate for electrostatic chuck which has insulation quality and can be joined onto a metal base member, the substrate for electrostatic chuck including a first electrode layer embedded in the substrate, close to an attraction surface which is an opposite side to a side to be joined to the base member, and a plurality of independent second electrode layers embedded in the substrate, at an opposite side to the first electrode layer, wherein an attraction direct current voltage is applied to the first electrode layer, and different radio frequencies for plasma control are fed to the plurality of independent second electrode layers, respectively.

According to another aspect of the invention, there is provided an electrostatic chuck including a metal base member, and an insulating substrate having an attraction surface and an opposite surface to the attraction surface, the opposite surface being joined onto the base member via an adhesive layer, wherein the substrate includes a first electrode layer embedded in the substrate, close to the attraction surface, and a plurality of independent second electrode layers embedded in the substrate, at an opposite side to the first electrode layer, wherein an attraction direct current voltage is applied to the first electrode layer, and different radio frequencies for plasma control are fed to the plurality of independent second electrode layers, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
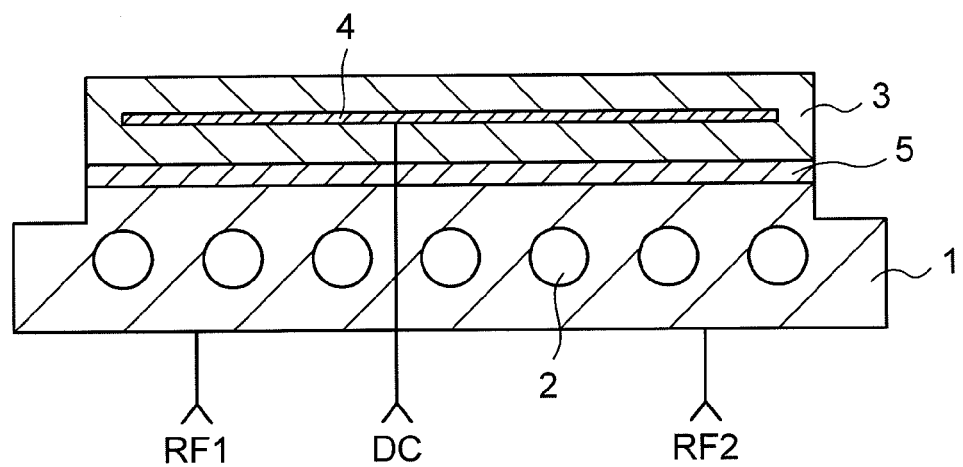
FIG. 1A is a diagram illustrating a configuration example of the case in which radio-frequency waves for plasma control are applied to a base plate of an electrostatic chuck.

Before giving descriptions of embodiments, preliminary matters for facilitating the understanding of the embodiments are described below.

(Preliminary Matters . . . See FIGS. 1A and 1B)

Dry etching is a known technique for etching an etching object made of a silicon compound such as silicon, silicon dioxide, or silicon nitride, a metal such as aluminum, tungsten, molybdenum, or titanium, or a polymer such as a resist, by use of a plasma etching apparatus, a reactive sputter etching apparatus, or the like. This technique includes various types, such as reactive ion etching (RIE), electron cyclotron resonance (ECR) etching, and downflow etching. Among these types, having characteristics of mass productivity and anisotropic etching which enables fine pattern formation, RIE, RF-bias ECR etching, and the like have conventionally been in wide use in manufacture of semiconductor devices, liquid crystal panels, and the like.

For example, in manufacture of a semiconductor device, in an RIE apparatus, first, a wafer is placed on a radio frequency (RF) electrode installed in a chamber, and the chamber is degassed. A plasma generating gas is then introduced into the chamber, and the chamber is controlled to have a predetermined internal pressure through adjustment of the flow and the exhaust velocity of the gas. Next, a predetermined radio-frequency power is fed to the RF electrode through an RF matcher to generate plasma in the chamber. Then, the wafer is etched by exposing a surface of the wafer to the plasma to react therewith.

In this event, a required etching mask (resist) is applied to the surface of the wafer so that only target portions on the wafer are selectively etched. At the time of the etching, the wafer is heated by heat generated from chemical reaction with the plasma and by incident energy of collision of ions or the like in the plasma state. Since the heat burns the resist on the wafer, the wafer needs to be cooled. Further, since the etching process is easily affected by the temperature, precise control of the wafer temperature is important in fine pattern formation.

For such temperature control, it is necessary to appropriately adjust the temperature of the RF electrode on which the wafer is placed, by using a medium such as cooling water, and also to bring the wafer and the RF electrode into tight contact to each other to increase the thermal conductivity therebetween. For those reasons, an electrostatic chuck (substrate) is provided on the RF electrode, and the wafer is brought into tight contact with the electrostatic chuck. In other words, the contact area is increased for a thermal contact so that the control of the wafer temperature can be effectively performed.

Apparatuses using plasma, such as the dry etching apparatus and the CVD apparatus, feed not only the aforementioned radio-frequency wave for plasma generation, but also a radio-frequency power for plasma control (a bias frequency). Thereby, energy for colliding generated ion or the like in the plasma state against a process object (such as a wafer) is controlled so that an etching process can be performed effectively. This bias frequency is appropriately set according to the attribute of the process object, the type of a plasma-generating gas, or the like.

Figure 1B:
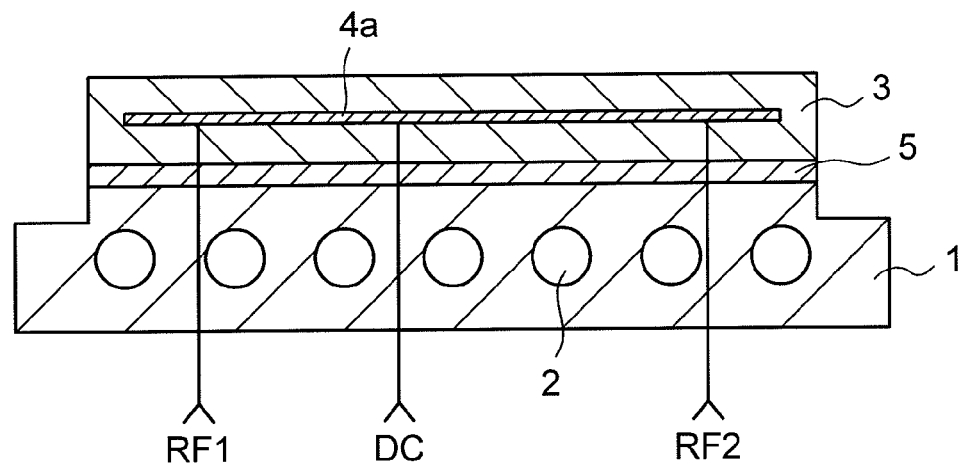
FIG. 1B is a diagram illustrating a configuration example of the case in which radio-frequency waves for plasma control are applied to an electrostatic-attraction electrode layer of the electrostatic chuck.

In a current technique, to control generated plasma, multiple bias frequencies (typically, two different radio-frequency waves) are superimposed and applied to (a conductive portion used as an electrode of) the electrostatic chuck. FIGS. 1A and 1B exemplifies how the bias frequencies are applied. FIG. 1A illustrates a configuration example where radio-frequency waves for plasma control are applied to a base plate of an electrostatic chuck, and FIG. 1B illustrates a configuration example where the radio-frequency waves for plasma control are applied to an electrostatic-attraction electrode layer of the electrostatic chuck.

In the configuration example illustrated in FIG. 1A, an electrostatic chuck substrate 3 is made of a ceramic material and has an electrostatic-attraction electrode layer 4 embedded therein, and a base plate 1 is made of aluminum or the like and has therein cooling flow channels 2 for passing a coolant such as water therethrough. The electrostatic chuck substrate 3 is fixed to and held by the base plate 1 with an adhesive layer 5 interposing therebetween. In the example in FIG. 1A, structures such as a joint portion for the coolant, a portion for power feeding, and the like are omitted. In the structure illustrated in FIG. 1A, when the electrostatic chuck is used, a direct-current (DC) voltage for wafer attraction is applied to the electrostatic-attraction electrode layer 4, and two different radio-frequency waves (RF1, RF2) for plasma control are applied to the base plate 1 (or specifically, to a conductive portion constituting the main body of the base plate 1 since the surface of the base plate 1 is subjected to insulation treatment such as anodizing treatment).

In the configuration example illustrated in FIG. 1B, on the other hand, the configuration is basically the same as that illustrated in FIG. 1A, but is different therefrom in that, when the electrostatic chuck is used, not only the DC voltage for attraction but also the radio-frequency waves (RF1, RF2) for plasma control are applied simultaneously to an electrostatic-attraction electrode layer 4a.

Instead of the method in which the two different radio-frequency waves (bias frequencies) are applied simultaneously, there is a method in which the radio-frequency waves are applied separately. For example, a "rough" etching process is performed using the lower radio-frequency wave, and then a "finishing" etching process is performed using the higher radio-frequency wave. By employing such two-step processing, a fine, even etching process can be achieved, compared to when the etching process is performed using only a single radio-frequency wave.

It has been a general practice for a dry etching apparatus and the like using plasma to individually control the energy of ions or the like in the plasma state by applying multiple bias frequency waves (radio frequency waves for plasma control) to a conductive portion (the base plate 1 or the electrostatic-attraction electrode layer 4a) used as an electrode for the electrostatic chuck, either simultaneously or separately.

Next, the embodiments are described.

First Embodiment

Figure 2A:
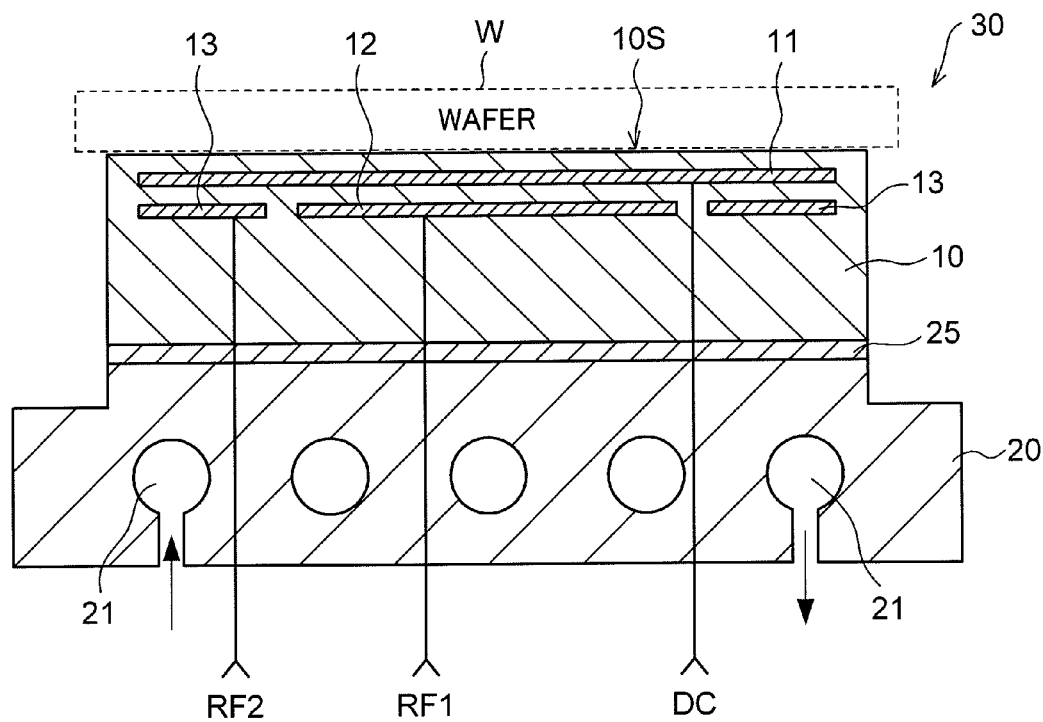
FIG. 2A is a vertical cross-sectional view illustrating the configuration of an electrostatic chuck according to a first embodiment.
Figure 3:
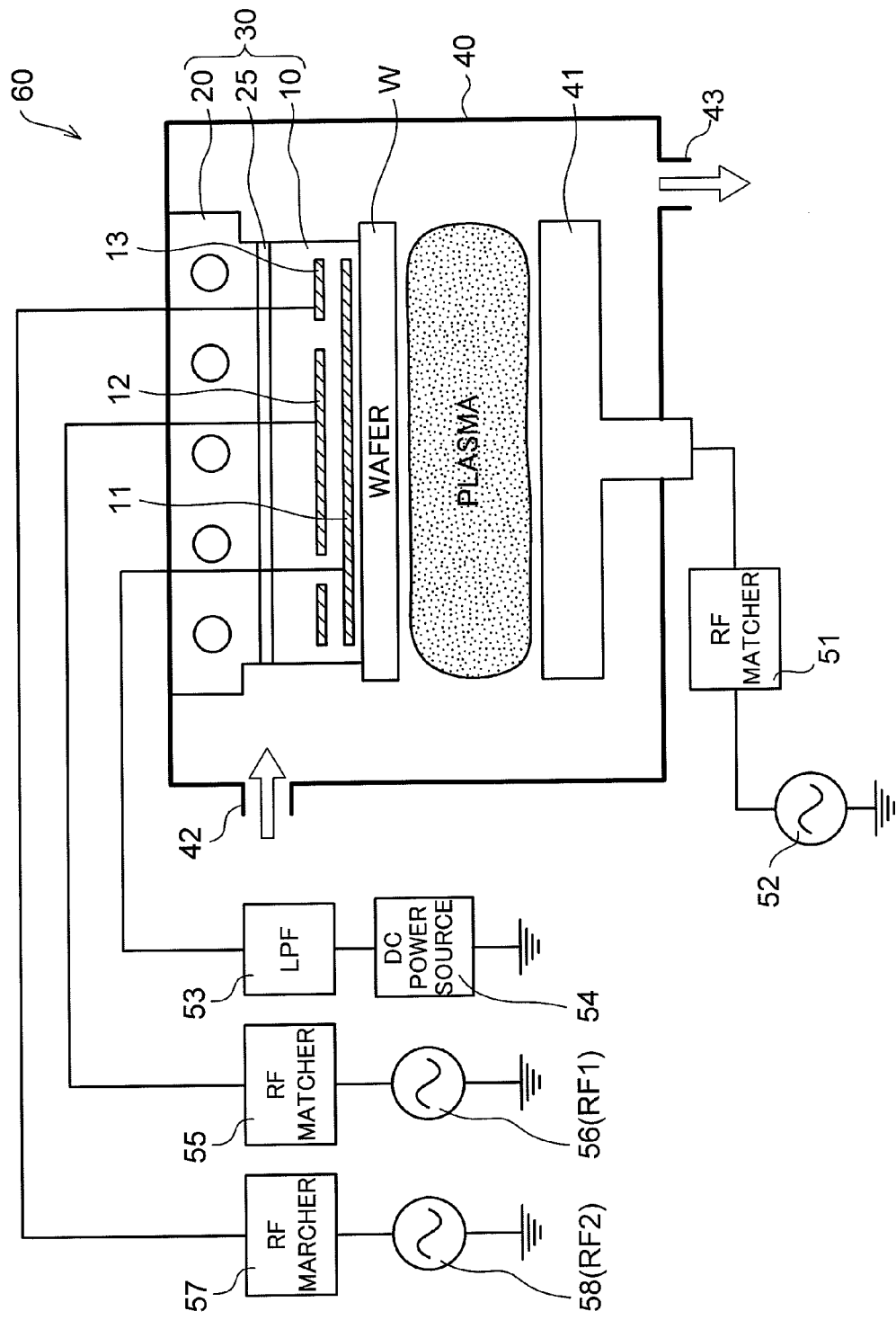
FIG. 3 is a diagram illustrating a configuration example of a process apparatus (an RIE apparatus) using the electrostatic chuck in FIGS. 2A and 2B.

See FIGS. 2A, 2A and 3

Figure 2B:
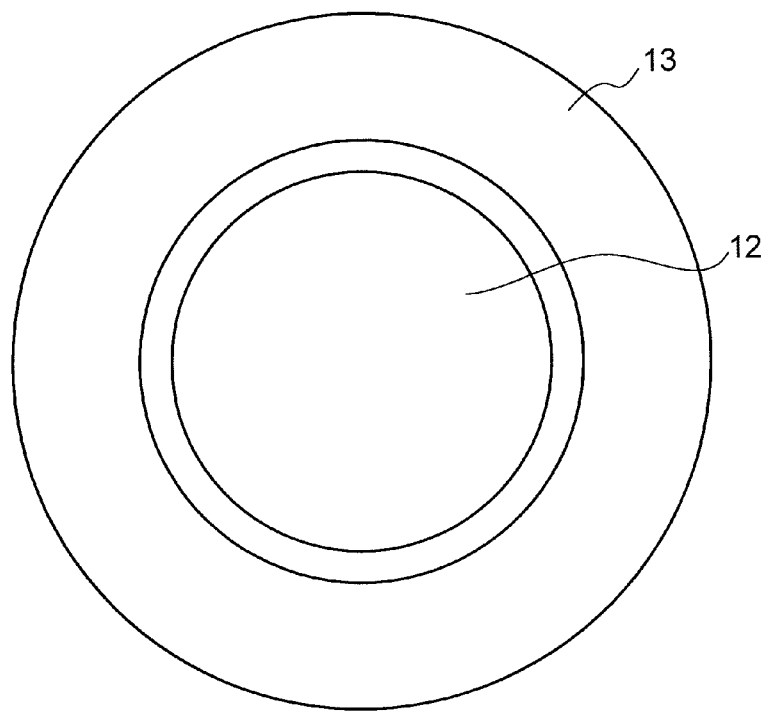
FIG. 2B is a plan view illustrating the arrangement of multiple RF electrode layers in FIG. 2A.

FIGS. 2A and 2B illustrate the configuration of an electrostatic chuck according to a first embodiment. Specifically, FIG. 2A illustrates a vertical cross-sectional structure of the electrostatic chuck, and FIG. 2B illustrates the arrangement of multiple RF electrode layers in FIG. 2A viewed in plane from the attraction surface side.

An electrostatic chuck 30 according to the present embodiment basically includes a metal base (a base plate) 20 and an electrostatic chuck substrate 10 (also simply called a "substrate" below) joined (held fixedly) onto the base plate 20 with an adhesive layer interposing therebetween. A wafer W as a process object is held by attraction onto the substrate 10.

It suffices if the base plate 20 is made of a conductive material which is, for example, a metal material such as aluminum (Al) or a carbide, a material combining the metal material and a ceramic material, or the like. In the present embodiment, aluminum (Al) or an alloy thereof having its surface anodized (provided with an insulating layer) is used because of its availability, processability, and the like.

Further, as illustrated in FIG. 2A, multiple cooling flow channels 21 are formed in parallel in a surface of the base plate 20 which is in parallel with the adhesive layer 25, and are continuous to one another in the base plate 20. The temperature of the wafer W can be adjusted to a predetermined temperature by causing a cooling medium such as water or helium (He) gas to flow from the leftmost flow channel 21 to the rightmost flow channel 21 as illustrated in the arrows in FIG. 2A, the wafer W being held by attraction on the substrate 10 joined onto the base plate 20 (or more specifically, onto the adhesive layer 25). Note that the base plate 20 can also be used as an electrode for generating plasma.

As the adhesive layer 25, an insulating rubber adhesive, such as a silicone resin, is used. The thickness of the adhesive layer 25 is set to, for example, about 100 μm.

It basically suffices if the electrostatic chuck substrate 10 is made of an insulating material: for example, a ceramic material such as alumina, aluminum nitride, or silicon nitride, or an organic material such as a silicone resin or a polyimide resin can be used. In the present embodiment, a ceramic such as alumina or aluminum nitride is used for such reasons as availability, processability, and relatively high durability against plasma and the like. Having thermal conductivity of as large as 150 to 250 W/(m·K), aluminum nitride is particularly preferable in reducing the temperature difference in the surface of the wafer W held by attraction onto the substrate 10.

The substrate 10 is formed slightly smaller than the wafer W (having a diameter of 300 mm for example) being held thereto. This makes at least an attraction surface 10S not be exposed to plasma. The substrate 10 is formed with a thickness of about 20 mm for example.

Desired electrode layers 11, 12, 13 are embedded in the substrate 10. Since the material for the substrate 10 is ceramic, tungsten (W), molybdenum (Mo), copper (Cu), or the like is preferably used as a material for the electrode layers 11, 12, 13. For example, the substrate 10 can be fabricated as desired in the following manner. Specifically, by a thick film processing, the electrode layers 11, 12, 13 are patterned on respective ceramic green sheets each obtained by staking ceramic green sheets to a required thickness. Then, the ceramic green sheets are integrally calcined with a ceramic material interposing therebetween.

In this substrate 10, the attraction electrode to which a direct-current (DC) voltage for electrostatic attraction is applied is formed in a circle in a portion, of the substrate 10, close to the attraction surface 10S attracting the wafer W (the portion being, for example, a position 0.5 mm away from the attraction surface 10S). In addition, the multiple independent RF electrode layers 12, 13 are formed in portions, of the substrate, at an opposite side of the first electrode layer to the attraction surface. Plasma-controlling radio-frequency powers which are different from each other are fed to these RF electrode layers 12, 13, respectively.

In the present embodiment, the RF electrode layer (RF1) 12 to which a radio-frequency power of frequency RF1 is fed is formed in a circle at a position 0.5 mm away from the attraction electrode layer 11 in the vicinity of an inner, center portion of the substrate 10. Moreover, around the RF electrode layer (RF1) 12, the RF electrode layer (RF2) 13 to which a radio-frequency power of RF2 is fed is formed in a circular ring (see FIG. 2B). In other words, as FIG. 2A illustrates, the RF electrode layers 12, 13 are on the same plane and arranged separately from each other.

In the above arrangement example, a distance secured between an opposite surface of the substrate 10 to the attraction surface 10S (namely, a side joined to the adhesive layer 25) and each of the RF electrode layers 12, 13 is about 19 mm (=20 mm−0.5 mm−0.5 mm). In other words, while a distance between the attraction surface 10S to which the wafer W is held and each of the RF electrode layers 12, 13 is as small as about 1 mm, a distance of as large as about 19 mm is secured for the thickness of a portion of the substrate 10 below the RF electrode layers 12, 13. Thereby, the position of the adhesive layer 25 can be set at a relatively low position.

FIG. 3 illustrates a configuration example of a process apparatus (an RIE apparatus) using the electrostatic chuck 30 (FIG. 2) of the first embodiment.

In an RIE (reactive ion etching) apparatus 60 in FIG. 3, the electrostatic chuck 30 is installed in a chamber 40 in such a manner as to hold the wafer W on its bottom side by attraction. In other words, the wafer W is held in such a manner as to defy gravity so that dust and the like would not attach to the surface thereof. Further, in the chamber 40, an opposite electrode 41 for plasma generation is placed at a side opposite to the side where the electrostatic chuck 30 is installed (namely, the side facing the surface of the wafer W). Reference numeral 42 indicates a gas feed port for feeding a plasma-generating gas into the gas chamber 40, and reference numeral 43 indicates an exhaust port for exhausting gas in the chamber 40.

A radio-frequency power for plasma generation (e.g., 13.56 MHz) is fed to the opposite electrode 41 in the chamber 40 from an RF power source 52 through an RF matcher 51 installed outside the chamber 40. A DC voltage for electrostatic attraction (e.g., DC 500 V to 50 kV) is fed to the attraction electrode layer 11 embedded in the substrate 10 of the electrostatic chuck 30 from a DC power source 54 through a low pass filter (LPF) 53 installed outside the chamber 40. Similarly, radio-frequency powers for plasma control (e.g., RF1=27 MHz, RF2=60 MHz) are fed to the RF electrode layers 12, 13 embedded in the substrate 10 from an RF power source 56 (RF1) and an RF power source 58 (RF2) through RF matchers 55, 57 installed outside the chamber 40, respectively.

As is clear from the gist of the present invention (namely, to supply radio-frequency waves for plasma (ion energy) control to respective multiple separate portions in the substrate), the values of the radio-frequency powers fed from the respective RF power sources 52, 56, 58 are not important. Appropriate radio-frequency waves other than those given in the above example can be selected. In the present embodiment, appropriate frequency waves are selected from ones generally used for industrial purposes, specifically, from 380 kHz, 400 kHz, 1 MHz, 2 MHz, 13.56 MHz, 27 MHz, 40 MHz, 60 MHz, 100 MHz, and the like.

In the RIE apparatus 60 illustrated in FIG. 3, first, a desired DC voltage is fed to the attraction electrode layer 11 embedded in the substrate 10 of the electrostatic chuck 30 from the DC power source 54 through the LPF 53. Thereby, a coulombic force acts between the wafer W having a floating potential and the electrode layer 11, causing the wager W to be held by attraction to the electrostatic chuck 30 (the substrate 10).

Next, with the wafer W being held by attraction to the electrostatic chuck 30, the chamber 40 is degassed through the exhaust port 43. Then, a gas for plasma generation (e.g., a mixed gas of silicon tetrachloride and chlorine: $SiCl_4+Cl_2$) is fed into the chamber 40 through the gas feed port 42, and the internal pressure of the chamber 40 is maintained at a predetermined value (e.g., 0.05 Torr) through adjustment of the flow and the exhaust velocity of the gas. Further, a desired radio-frequency power (e.g., 13.56 MHz) is fed to the opposite electrode 41 from the RF power source 52 through the RF matcher 51, to thereby generate plasma in the chamber 40. The surface of the wafer W is exposed to, and reacts with, the plasma thus generated, and thus the wafer W is etched.

Furthermore, to control the plasma (ion energy) thus generated, predetermined radio-frequency powers (e.g., RF1=27 MHz, RF2=60 MHz) are fed to the RF electrode layers 12, 13 embedded in the substrate 10 of the electrostatic chuck 30 from the RF power source 56 (RF1) and the RF power source 58 (RF2) through the RF matchers 55, 57, respectively.

Specifically, plasma is generated at 13.56 MHz, and plasma ions are accelerated at 27 MHz and 60 MHz. Thus, radical generation and ion energy are controlled separately so that the etching process can be performed with high accuracy and high efficiency.

As described above, in the configuration of the electrostatic chuck 30 according to the present embodiment (FIGS. 2A and 2B), the RF electrode layer (RF1) 12 and the RF electrode layer (RF2) 13 are provided in respective multiple separate portions in the substrate 10. Radio-frequency waves for plasma control which are different from each other are applied to those independent RF electrode layers 12, 13. In other words, the RF electrode layers 12, 13 are specialized for their corresponding radio-frequency waves (RF1, RF2); therefore, the density distribution of in-plane ion energy can be easily controlled to a targeted one.

Further, since the RF electrode layers 12, 13 are arranged inside the substrate 10, the distance between the attraction surface 10S onto which the wafer W is held and each of the RF electrode layers 12, 13 can be shortened (to about 1 mm while the thickness of the substrate 10 is 20 mm), allowing the radio-frequency powers to be transmitted to the wafer W efficiently. Accordingly, even if the thickness of the substrate 10 is increased, the power loss can be reduced by arranging the RF electrode layers 12, 13 at positions near the wafer W. Accordingly, the process apparatus can be operated with a minimal radio-frequency power. Thereby, less load is put on the RF power sources 56, 58 and the RF matchers 55, 57.

In addition, while the RF electrode layers 12, 13 are arranged at positions in the substrate 10 which are close to the wafer W, the thickness of the substrate 10 itself can be increased. Accordingly, the thickness of a portion of the substrate 10 below the RF electrode layers 12, 13 can be largely secured. Thereby, the position of the adhesive layer 25 is set at a relatively low position, allowing a drastic decrease in the damage by plasma and gas. In other words, the deterioration of the adhesive layer 25 progresses less, which can contribute to elongating the overall life of the electrostatic chuck 30.

Furthermore, not depending on the joining material (the adhesive layer 25) in the electrostatic chuck 30 and how the joining material joins, coupling between the plasma-control radio-frequency waves (RF1, RF2) and the wafer W can be achieved.

Second Embodiment

Figure 4A:
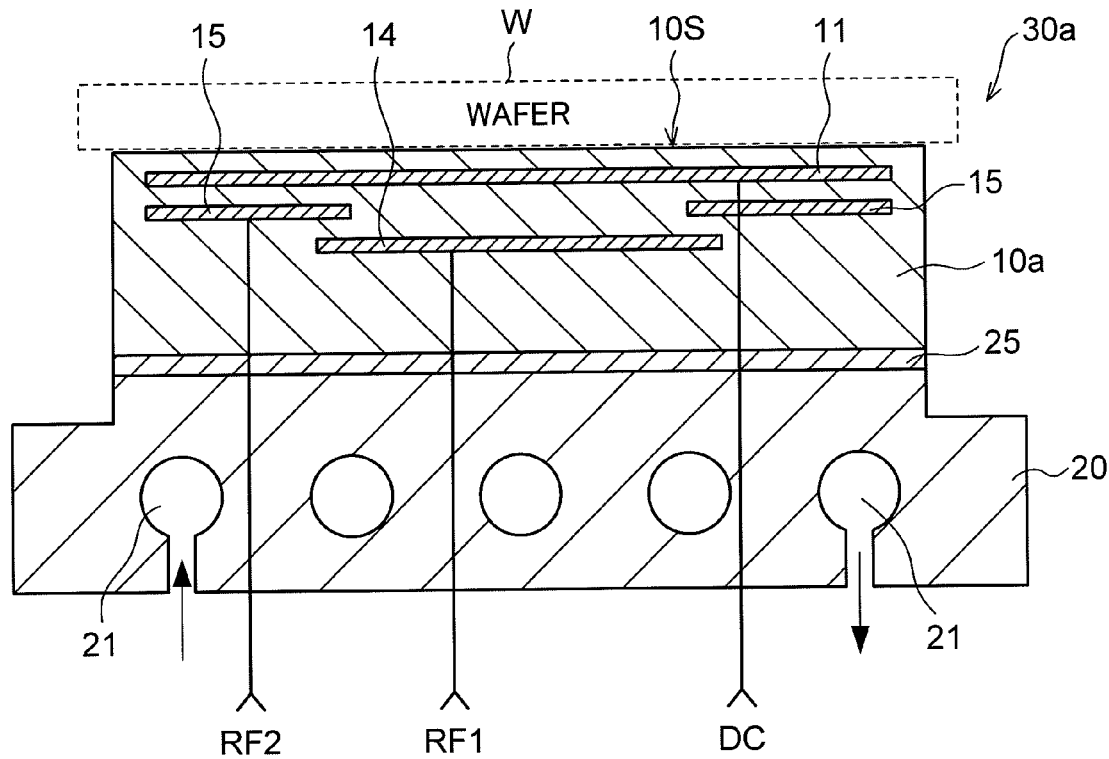
FIG. 4A is a vertical cross-sectional view illustrating the configuration of an electrostatic chuck according to a second embodiment.
Figure 4B:
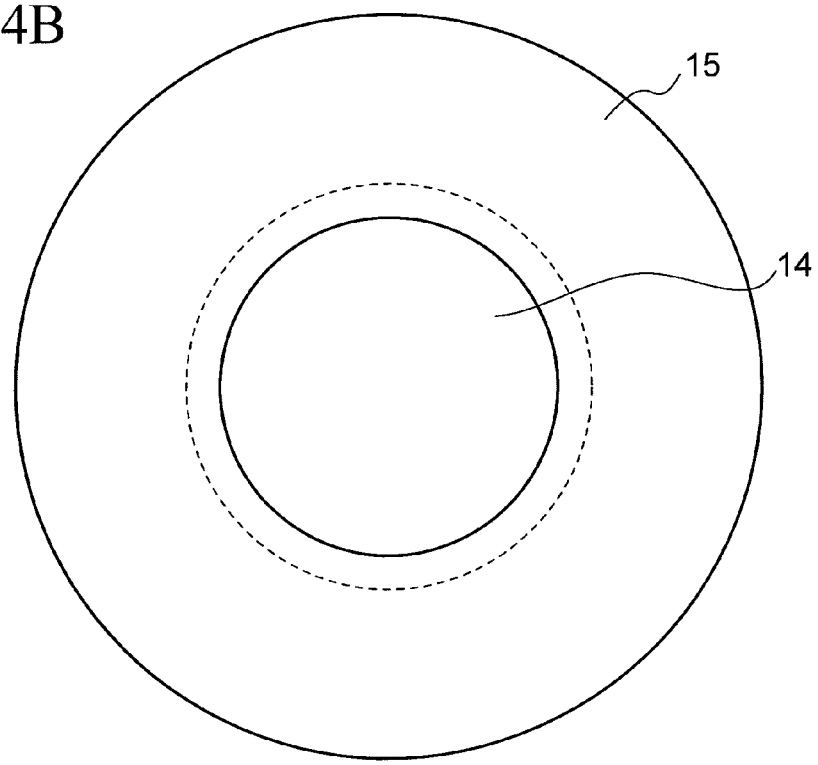
FIG. 4B is a plan view illustrating the arrangement of multiple RF electrode layers in FIG. 4A.

See FIGS. 4A and 4B

In the above-described electrostatic chuck 30 according to the first embodiment (FIGS. 2A and 2B), the RF electrode layers 12, 13 are arranged separately on the same plane; accordingly, the RF electrode layers 12, 13 naturally have a space portion (an insulating-layer portion of the substrate 10) therebetween. For this reason, there is a possibility that how the wafer W held by attraction to the attraction surface 10S is processed through etching or the like varies widely between a portion corresponding to the space portion (the insulating-layer portion of the substrate 10) and portions corresponding to the RF electrode layers 12, 13. This is improved in an embodiment described below.

FIGS. 4A and 4B illustrate the configuration of an electrostatic chuck according to a second embodiment. Specifically, FIG. 4A illustrates a vertical cross-sectional structure of the electrostatic chuck, and FIG. 4B illustrates the arrangement of multiple RF electrode layers in FIG. 4A viewed in plane from the attraction surface side.

The configuration of an electrostatic chuck 30a according to the second embodiment (FIGS. 4A and 4B) is different from that of the electrostatic chuck 30 according to the first embodiment (FIGS. 2A and 2B) in the arrangement of RF electrode layers 14, 15 embedded in an inner portion (an insulating-layer portion) of an electrostatic chuck substrate 10a. Other configurations are the same as those of the first embodiment, and are therefore not described here.

In the second embodiment, as is similar to the first embodiment, the attraction electrode layer 11 is formed in a circle at a position 0.5 mm away from the attraction surface 10S of the substrate 10a, and the RF electrode layer (RF2) 15 to which a radio-frequency power of frequency RF2 is fed is formed in a circular ring at a position 0.5 mm away from the attraction electrode layer 11 in the vicinity of an inner, outer circumferential portion of the substrate 10a (see FIG. 4B). In addition, the RF electrode layer (RF1) 14 to which a radio-frequency power of frequency RF1 is fed is formed in a circle at a position 0.3 to 0.5 mm away from the RF electrode layer (RF2) 15 in the vicinity of an inner, center portion of the substrate 10a. In other words, as illustrated in FIG. 4A, the RF electrode layers 14, 15 are not formed on the same plane, but arranged separately in different layers.

Further, as illustrated in FIG. 4B, the RF electrode layers 14, 15 are arranged in such a manner as to partially overlap each other in a plan view. In other words, the circular RF electrode layer (RF2) 15 is arranged so that an inner periphery portion thereof may overlap a periphery portion of the circular-ring RF electrode layer (RF1) 14.

In the arrangement example of the present embodiment, as is similar to the arrangement example in the first embodiment, while a distance between the attraction surface 10S to which the wafer W is held and the RF electrode layer (RF1) 14 which is the lowermost layer is as extremely small as about 1.3 to 1.5 mm (=0.5 mm+0.5 mm+0.3 to 0.5 mm), a distance of as large as about 18.5 to 18.7 mm is secured for the thickness of a portion of the substrate 10a below the RF electrode layer (RF1) 14. In other words, the position of the adhesive layer 25 is set at a relatively low position.

In such a configuration of the electrostatic chuck 30a according to the second embodiment, the following advantageous effects can be obtained in addition to those obtained in the first embodiment described above. Specifically, since the RF electrode layers 14, 15 are arranged in such a manner as not to form the "space portion" as formed in the first embodiment (FIG. 2B), but to partially overlap each other in a plan view, variations in how the wafer W is processed through etching or the like can be practically eliminated.

In the second embodiment, the RF electrode layers 14, 15 are arranged in such a manner as to partially overlap each other in a plan view (FIGS. 4A and 4B). Note, however, that the RF electrode layers 14, do not necessarily have to overlap each other to obtain the effects produced by this embodiment. It suffices if at least the RF electrode layers 14, 15 are arranged in such a manner as not to form the "space portion" as formed in the first embodiment (FIG. 2B). For example, the RF electrode layers 14, 15 may be arranged so that their periphery portions coincide with each other in a plan view.

Further, in the second embodiment, the circular RF electrode layer (RF1) 14 is arranged below the circular-ring RF electrode layer (RF2) 15; however, the RF electrode layers 14, 15 do not necessarily have to be arranged in this order, but may be arranged in the reverse order to that in the example illustrated in FIGS. 4A and 4B.

Third Embodiment

Figure 5A:
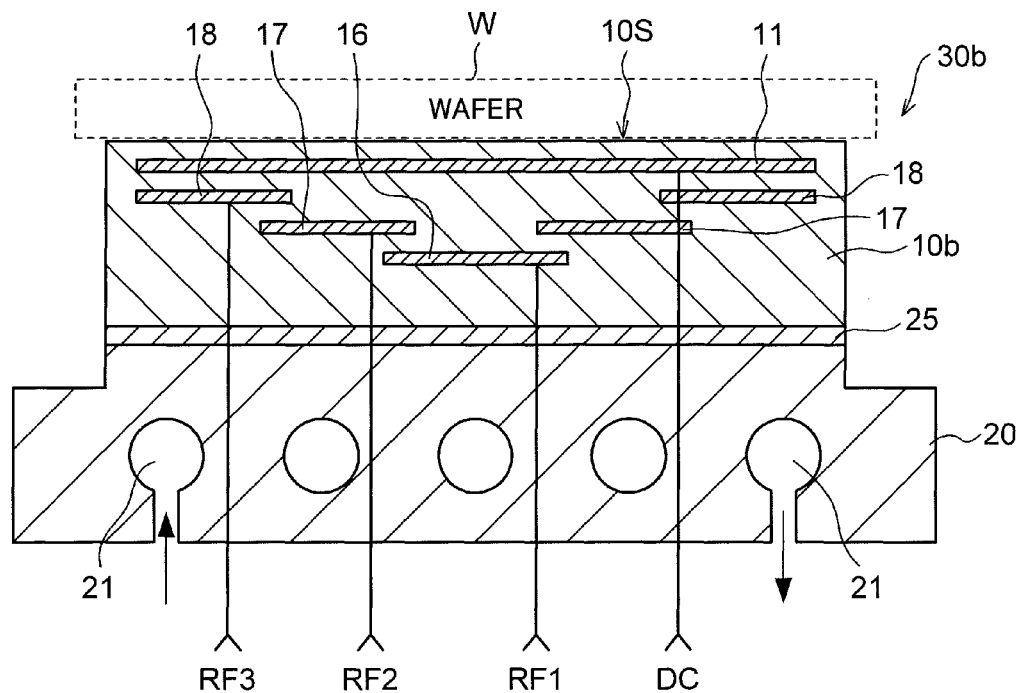
FIG. 5A is a vertical cross-sectional view illustrating the configuration of an electrostatic chuck according to a third embodiment.

See FIGS. 5A and 5A

Figure 5B:
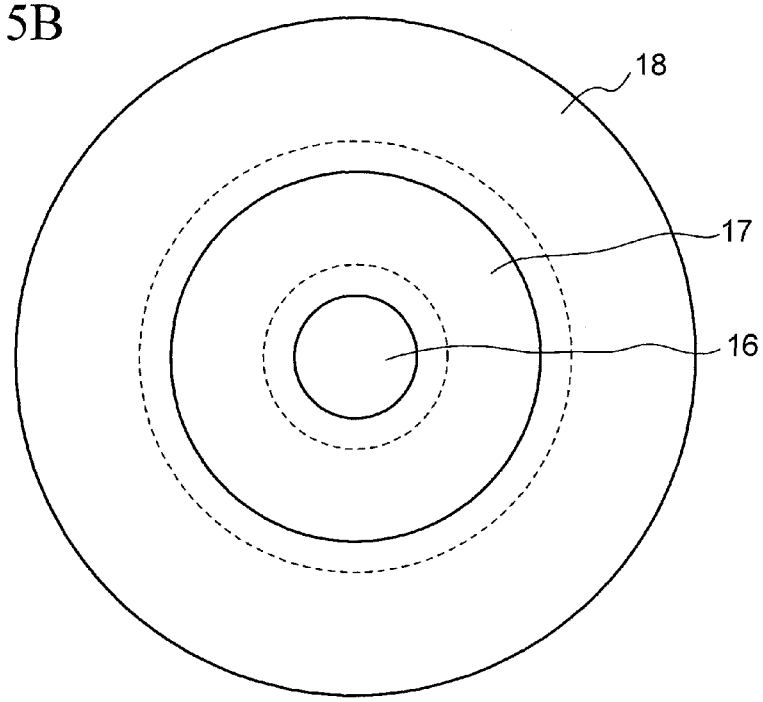
FIG. 5B is a plan view illustrating the arrangement of multiple RF electrode layers in FIG. 5A.

FIGS. 5A and 5B illustrate the configuration of an electrostatic chuck according to a third embodiment. Specifically, FIG. 5A illustrates a vertical cross-sectional structure of the electrostatic chuck, and FIG. 5B illustrates the arrangement of multiple RF electrode layers in FIG. 5A viewed in plane from the attraction surface side.

The configuration of an electrostatic chuck 30b according to the third embodiment (FIGS. 5A and 5B) is different from that of the electrostatic chuck 30 according to the first embodiment (FIGS. 2A and 2B) in the arrangement of RF electrode layers 16, 17, 18 embedded in an inner portion (an insulating-layer portion) of an electrostatic chuck substrate 10b. Other configurations are the same as those of the first embodiment, and are therefore not described here.

In this third embodiment, as is similar to the first embodiment, the attraction electrode layer 11 is formed in a circle at a position 0.5 mm away from the attraction surface 10S of the substrate 10b. Further, the RF electrode layer (RF3) 18 to which a radio-frequency power of frequency RF3 is fed is formed in a circular ring at a position 0.5 mm away from the attraction electrode layer 11 in the vicinity of an inner, outer circumferential portion of the substrate 10a (see FIG. 5B). In addition, the RF electrode layer (RF2) 17 to which a radio-frequency power of frequency RF2 is fed is formed in a circular ring at a position 0.3 to 0.5 mm away from the RF electrode layer (RF3) 18 in a portion inside of the RF electrode layer (RF3) 18. Further, the RF electrode layer (RF1) 16 to which a radio-frequency power of frequency RF1 is fed is formed in a circle at a position 0.3 to 0.5 mm away from the RF electrode layer (RF2) 17 in the vicinity of an inner, center portion of the substrate 10b. In other words, as illustrated in FIG. 5A, the RF electrode layers 16, 17, are not formed on the same plane, but arranged separately in different layers.

Moreover, as illustrated in FIG. 5B, the RF electrode layers 16, 17, 18 are arranged in such a manner as to partially overlap each other in a plan view. Specifically, the circular-ring RF electrode layer (RF2) 17 is arranged above the circular RF electrode layer (RF1) 16 in such a manner that an inner periphery portion of the RF electrode layer (RF2) 17 overlaps a periphery portion of the RF electrode layer (RF1) 16. Further, the circular-ring RF electrode layer (RF3) 18 is arranged above the RF electrode layer (RF2) 17 in such a manner that an inner periphery portion of the RF electrode layer (RF3) 18 overlaps an outer periphery portion of the RF electrode layer (RF2) 17.

In the arrangement example of the present embodiment, as is similar to the arrangement example in the first embodiment, while a distance between the attraction surface 10S to which the wafer W is held and the RF electrode layer (RF1) 16 which is the lowermost layer is as extremely small as about 1.6 to 2.0 mm (=0.5 mm+0.5 mm+0.3 to 0.5 mm+0.3 to 0.5 mm), a distance of as large as about 18.0 to 18.4 mm is secured for the thickness of a portion of the substrate 10b below the RF electrode layer (RF1) 16. In other words, the position of the adhesive layer 25 is set at a relatively low position.

In such a configuration of the electrostatic chuck 30b according to the third embodiment, the advantageous effects similar to those obtained in the second embodiment described above can be obtained. Specifically, since the RF electrode layers 16, 17, 18 are arranged in such a manner as not to form the "space portion" as formed in the first embodiment (FIG. 2B), but to partially overlap each other in a plan view, variations in how the wafer W is processed through etching or the like can be practically eliminated.

In the third embodiment, the RF electrode layers 16, 17, 18 are arranged in such a manner as to partially overlap each other in a plan view (FIGS. 5A and 5B). Note, however, that the RF electrode layers 16, 17, 18 do not necessarily have to overlap each other to obtain the effects produced by the third embodiment as in the above-described second embodiment (FIGS. 4A and 4B). It suffices if at least the RF electrode layers 16, 17, 18 are arranged in such a manner as not to form the "space portion" as formed in the first embodiment (FIG. 2B). For example, the RF electrode layers 16, 17, 18 may be arranged so that their periphery portions coincide with each other in a plan view.

Further, in the third embodiment, the circular RF electrode layer (RF2) 17 is arranged below the circular-ring RF electrode layer (RF3) 18 and the circular RF electrode layer (RF1) 16 is arranged below the circular-ring RF electrode layer (RF2) 17; however, the RF electrode layers 16, 17, 18 do not necessarily have to be arranged in this order, but may be arranged in the reverse order to that in the example illustrated in FIGS. 5A and 5B.

Fourth Embodiment

Figure 6A:
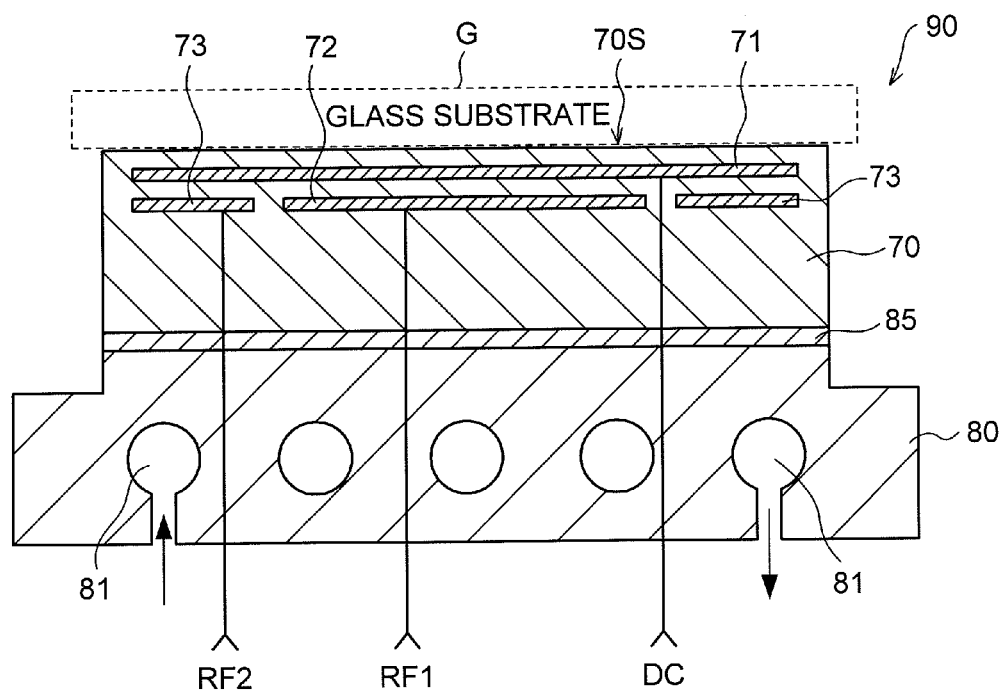
FIG. 6A is a vertical cross-sectional view illustrating the configuration of an electrostatic chuck according to a fourth embodiment.
Figure 6B:
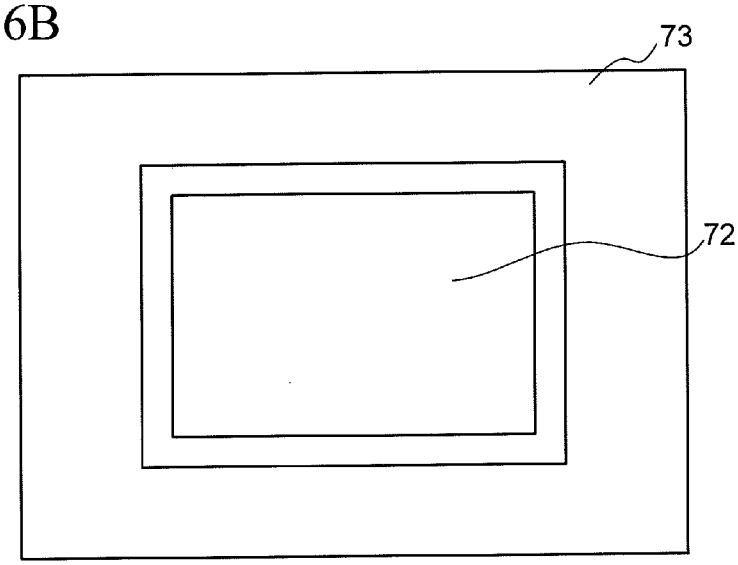
FIG. 6B is a plan view illustrating the arrangement of multiple RF electrode layers in FIG. 6A.

See FIGS. 6A and 6B

FIGS. 6A and 6B illustrate the configuration of an electrostatic chuck according to a fourth embodiment. Specifically, FIG. 6A illustrates a vertical cross-sectional structure of the electrostatic chuck, and FIG. 6B illustrates the arrangement of multiple RF electrode layers in FIG. 6A viewed in plane from the attraction surface side.

The configuration of an electrostatic chuck 90 according to the fourth embodiment (FIGS. 6A and 6B) is different from that of the electrostatic chuck 30 according to the first embodiment (FIGS. 2A and 2B) in the shape (in a plan view) of each of an attraction electrode layer 71 and RF electrode layers 72, 73 embedded in an inner portion (an insulating-layer portion) of an electrostatic chuck substrate 70. Other configurations (such as those of a base plate 80, cooling flow channels 81, and an adhesive layer 82) are the same as those of the first embodiment, and are therefore not described here.

In the fourth embodiment, as a process object, a glass substrate G for a liquid crystal panel is held by attraction onto the electrostatic chuck substrate 70. This glass substrate G is quadrangular (square or rectangular) in a plan view. Accordingly, the substrate 70 is formed slightly smaller than the glass substrate G (having a diameter of 2000 mm×2000 mm for example) being held thereto. This makes at least an attraction surface 70S not be exposed to plasma.

In the fourth embodiment, the attraction electrode layer 71 is formed in a rectangle at a position 0.5 mm away from the attraction surface 70S of the substrate 70. Further, the RF electrode layer (RF1) 72 to which a radio-frequency power of frequency RF1 is fed is formed in a rectangle at a position 0.5 mm away from the attraction electrode layer 71 in the vicinity of an inner, center portion of the substrate 70 (see FIG. 6B). Moreover, the RF electrode layer (RF2) 73 to which a radio-frequency power of frequency RF2 is fed is formed in a rectangular ring around the RF electrode layer (RF1) 72 (see FIG. 2B). In other words, as FIG. 6A illustrates, the RF electrode layers 72, 73 are on the same plane and arranged separately from each other.

In the arrangement example in the present embodiment, as is similar to the arrangement example in the first embodiment, while the distance between the attraction surface 70S to which the glass substrate G is held and each of the RF electrode layers 72, 73 is as extremely small as about 1 mm, a distance of as large as about 19 mm is secured for the thickness of a portion of the substrate 70 below the RF electrode layers 72, 73. In other words, the position of the adhesive layer 85 can be set at a relatively low position.

In the configuration of the electrostatic chuck 90 according to the fourth embodiment, although the process object is different from the first embodiment (i.e., the glass substrate G for a liquid crystal panel (FIGS. 6A and 6B) is used instead of the semiconductor wafer W (FIGS. 2A, 2B, and the like)), the basic configuration is the same as that of the first embodiment (FIGS. 2A and 2B). Accordingly, similar effects can be produced.

Particularly, some glass substrates for liquid crystal panels have a size exceeding 2000 mm×2000 mm, and are much larger than semiconductor wafers. For this reason, glass substrates tend to have large variations in radio-frequency powers. However, such a problem can be solved with the configuration of the electrostatic chuck 90 of the present embodiment. Accordingly, the present embodiment provides its effects more markedly than the first embodiment in which the semiconductor wafer W is a process object.

Fifth Embodiment

Figure 7A:
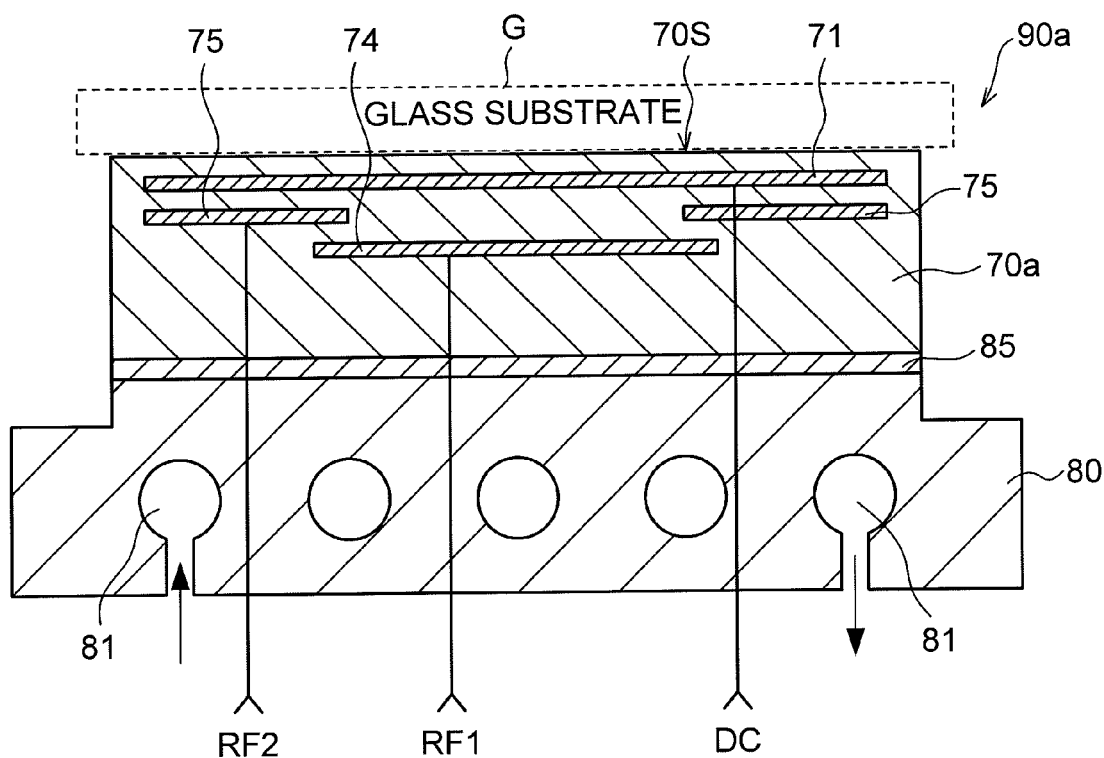
FIG. 7A is a vertical cross-sectional view illustrating the configuration of an electrostatic chuck according to a fifth embodiment.
Figure 7B:
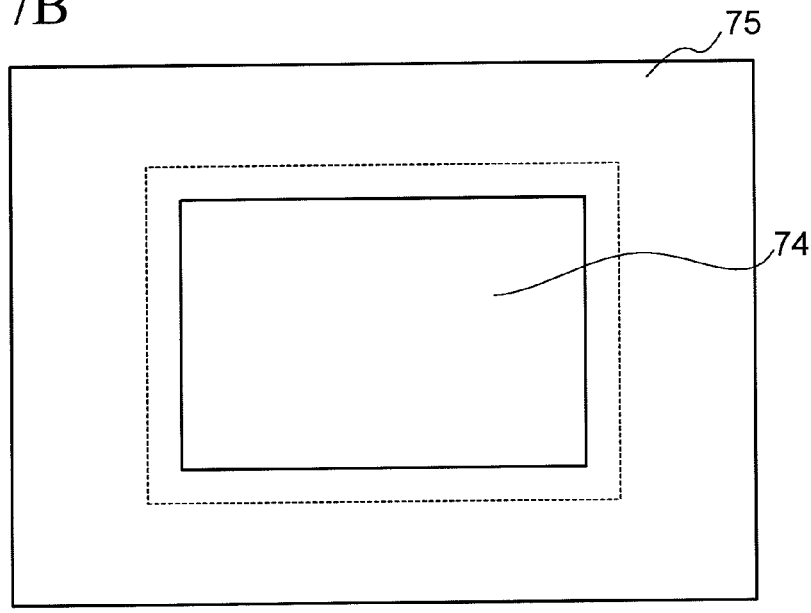
FIG. 7B is a plan view illustrating the arrangement of multiple RF electrode layers in FIG. 7A.

See FIGS. 7A and 7B

FIGS. 7A and 7B illustrate the configuration of an electrostatic chuck according to a fifth embodiment. Specifically, FIG. 7A illustrates a vertical cross-sectional structure of the electrostatic chuck, and FIG. 7B illustrates the arrangement of multiple RF electrode layers in FIG. 7A viewed in plane from the attraction surface side.

The configuration of an electrostatic chuck 90a according to the fifth embodiment (FIGS. 7A and 7B) is different from that of the electrostatic chuck 90 according to the fourth embodiment (FIGS. 6A and 6B) in the arrangement of RF electrode layers 74, 75 embedded in an inner portion (an insulating-layer portion) of an electrostatic chuck substrate 70a. Other configurations are the same as those of the fourth embodiment, and are therefore not described here.

In the fifth embodiment, as is similar to the fourth embodiment, the attraction electrode layer 71 is formed in a rectangular at a position 0.5 mm away from the attraction surface 70S of the substrate 70a. Further, the RF electrode layer (RF2) 75 to which a radio-frequency power of frequency RF2 is fed is formed in a rectangular ring at a position 0.5 mm away from the attraction electrode layer 71 in the vicinity of an inner, outer circumferential portion of the substrate 70a (see FIG. 7B). In addition, the RF electrode layer (RF1) 74 to which a radio-frequency power of frequency RF1 is fed is formed in a rectangle at a position 0.3 to 0.5 mm away from the RF electrode layer (RF2) 75 in the vicinity of an inner, center portion of the substrate 70a. In other words, as illustrated in FIG. 7A, the RF electrode layers 74, 75 are not formed on the same plane, but arranged separately in different layers.

Moreover, as illustrated in FIG. 7B, the RF electrode layers 74, 75 are arranged in such a manner as to partially overlap each other in a plan view. Specifically, the rectangular-ring RF electrode layer (RF2) 75 is arranged above the rectangular RF electrode layer (RF1) 74 in such a manner that an inner periphery portion of the RF electrode layer (RF2) 75 overlaps a periphery portion of the RF electrode layer (RF1) 74.

In the arrangement example of the present embodiment, as is similar to the arrangement example in the fourth embodiment, while a distance between the attraction surface 70S to which the glass substrate G is held and the RF electrode layer (RF1) 74 which is the lowermost layer is as extremely small as about 1.3 to 1.5 mm (=0.5 mm+0.5 mm+0.3 to 0.5 mm), a distance of as large as about 18.5 to 18.7 mm is secured for the thickness of a portion of the substrate 70a below the RF electrode layer (RF1) 74. In other words, the position of the adhesive layer 85 is set at a relatively low position.

With such a configuration of the electrostatic chuck 90a according to the fifth embodiment, the following advantageous effects can be obtained in addition to those obtained in the fourth embodiment described above. Specifically, since the RF electrode layers 74, 75 are arranged in such a manner as not to form the "space portion" as formed in the fourth embodiment (FIG. 6B), but to partially overlap each other in a plan view, variations in how the glass substrate G is processed through etching or the like can be practically eliminated.

In the fifth embodiment (FIGS. 7A and 7B), as is similar to the second and the third embodiments, the RF electrode layers 74, 75 are arranged in such a manner as to partially overlap each other in a plan view. Note, however, that the RF electrode layers 74, 75 do not necessarily have to overlap each other. For example, the RF electrode layers 74, 75 may be arranged so that their periphery portions coincide with each other in a plan view. Further, although the rectangular RF electrode layer (RF1) 74 is arranged below the rectangular-ring RF electrode layer (RF2) 75, the RF electrode layers 74, 75 do not necessarily have to be arranged in this order, but may be arranged in the reverse order to that in the example illustrated in FIGS. 7A and 7B.

Sixth Embodiment

Figure 8A:
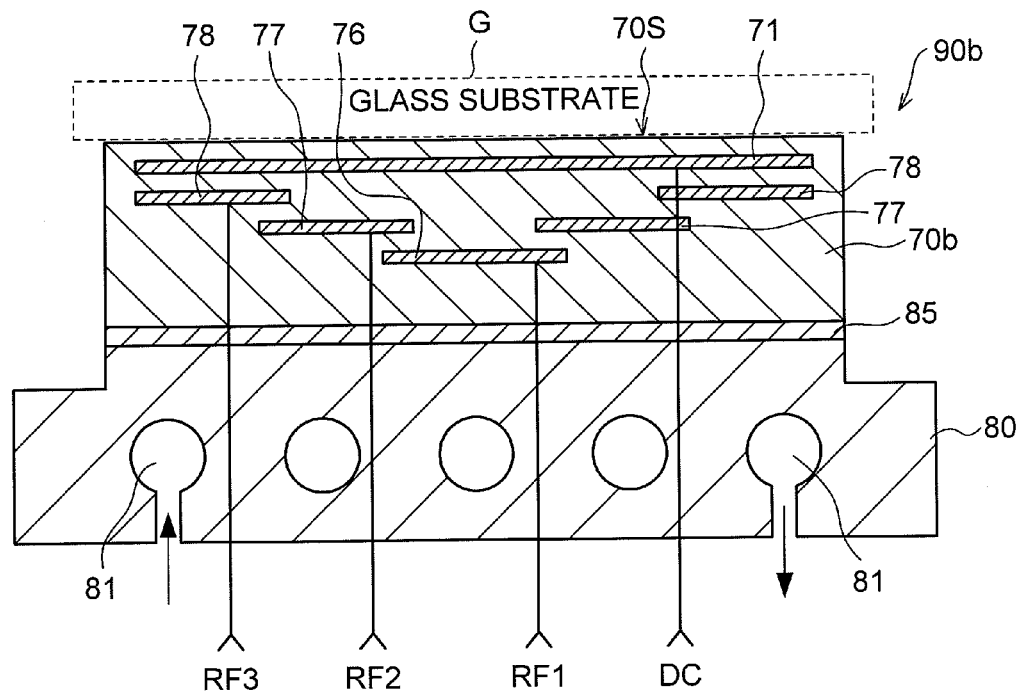
FIG. 8A is a vertical cross-sectional view illustrating the configuration of an electrostatic chuck according to a sixth embodiment.
Figure 8B:
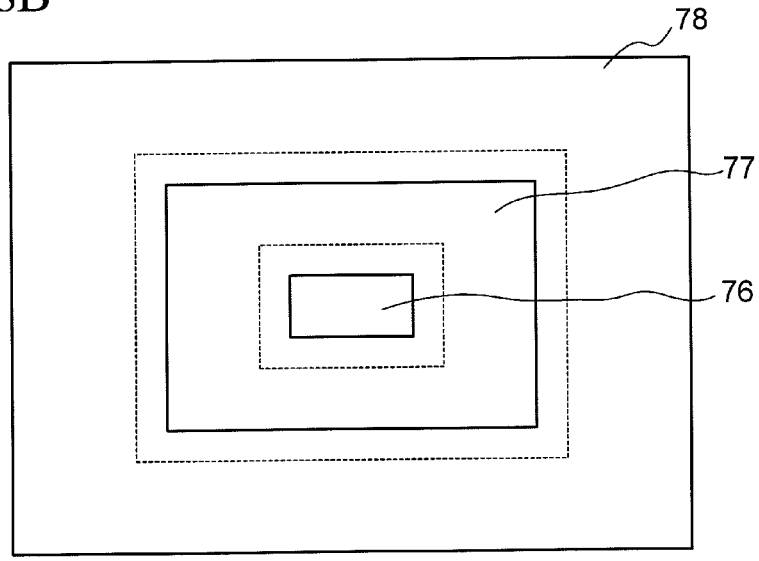
FIG. 8B is a plan view illustrating the arrangement of multiple RF electrode layers in FIG. 8A.

See FIGS. 8A and 8B

FIGS. 8A and 8B illustrate the configuration of an electrostatic chuck according to a sixth embodiment. Specifically, FIG. 8A illustrates a vertical cross-sectional structure of the electrostatic chuck, and FIG. 8B illustrates the arrangement of multiple RF electrode layers in FIG. 8A viewed in plane from the attraction surface side.

The configuration of an electrostatic chuck 90b according to the sixth embodiment (FIGS. 8A and 8B) is different from that of the electrostatic chuck 90 according to the fourth embodiment (FIGS. 6A and 6B) in the arrangement of RF electrode layers 76, 77, 78 embedded in an inner portion (an insulating-layer portion) of an electrostatic chuck substrate 70b. Other configurations are the same as those of the fourth embodiment, and are therefore not described here.

In the sixth embodiment, as is similar to the fourth embodiment, the attraction electrode layer 71 is formed in a rectangular at a position 0.5 mm away from the attraction surface 70S of the substrate 70b. Further, the RF electrode layer (RF2) 78 to which a radio-frequency power of frequency RF3 is fed is formed in a rectangular ring at a position 0.5 mm away from the attraction electrode layer 71 in the vicinity of an inner, outer circumferential portion of the substrate 70b (see FIG. 8B). In addition, the RF electrode layer (RF2) 77 to which a radio-frequency power of frequency RF2 is fed is formed in a rectangular ring at a position 0.3 to 0.5 mm away from the RF electrode layer (RF3) 78 in a portion inside of the RF electrode layer (RF3) 78. Further, the RF electrode layer (RF1) 76 to which a radio-frequency power of frequency RF1 is fed is formed in a rectangle at a position 0.3 to 0.5 mm away from the RF electrode layer (RF2) 77 in the vicinity of an inner, center portion of the substrate 70b. In other words, as illustrated in FIG. 8A, the RF electrode layers 76, 77, 78 are not formed on the same plane, but arranged separately in different layers.

Moreover, as illustrated in FIG. 8B, the RF electrode layers 76, 77, 78 are arranged in such a manner as to partially overlap each other in a plan view. Specifically, the rectangular-ring RF electrode layer (RF2) 77 is arranged above the rectangular RF electrode layer (RF1) 76 in such a manner that an inner periphery portion of the RF electrode layer (RF2) 77 overlaps a periphery portion of the RF electrode layer (RF1) 76 and the rectangular-ring RF electrode layer (RF3) 78 is arranged above the rectangular RF electrode layer (RF2) 77 in such a manner that an inner periphery portion of the RF electrode layer (RF3) 78 overlaps a periphery portion of the RF electrode layer (RF2) 77.

In the arrangement example of the present embodiment, as is similar to the arrangement example in the fourth embodiment, while a distance between the attraction surface 70S to which the glass substrate G is held and the RF electrode layer (RF1) 76 which is the lowermost layer is as extremely small as about 1.6 to 2.0 mm (=0.5 mm+0.5 mm+0.3 to 0.5 mm+0.3 to 0.5 mm), a distance of as large as about 18.0 to 18.4 mm is secured for the thickness of a portion of the substrate 70b below the RF electrode layer (RF1) 76. In other words, the position of the adhesive layer 85 is set at a relatively low position.

With such a configuration of the electrostatic chuck 90b according to the sixth embodiment, the advantageous effects similar to those obtained in the fifth embodiment (FIGS. 7A and 7B) described above can be obtained. Specifically, since the RF electrode layers 76, 77, 78 are arranged in such a manner as not to form the "space portion" as formed in the fourth embodiment (FIG. 6B), but to partially overlap each other in a plan view, variations in how the glass substrate G is processed through etching or the like can be practically eliminated.

In the sixth embodiment (FIGS. 8A and 8B), as is similar to the fifth embodiment, the RF electrode layers 76, 77, 78 are arranged in such a manner as to partially overlap each other in a plan view. Note, however, that the RF electrode layers 76, 77, 78 do not necessarily have to overlap each other. For example, the RF electrode layers 76, 77, 78 may be arranged so that their periphery portions coincide with each other in a plan view. Further, although the rectangular RF electrode layer (RF2) 77 is arranged below the rectangular-ring RF electrode layer (RF3) 78, and the rectangular RF electrode layer (RF1) 76 is arranged below the rectangular-ring RF electrode layer (RF2) 77, the RF electrode layers 76, 77, 78 do not necessarily have to be arranged in this order, but may be arranged in the reverse order to that in the example illustrated in FIGS. 8A and 8B.

Seventh Embodiment

Figure 9A:
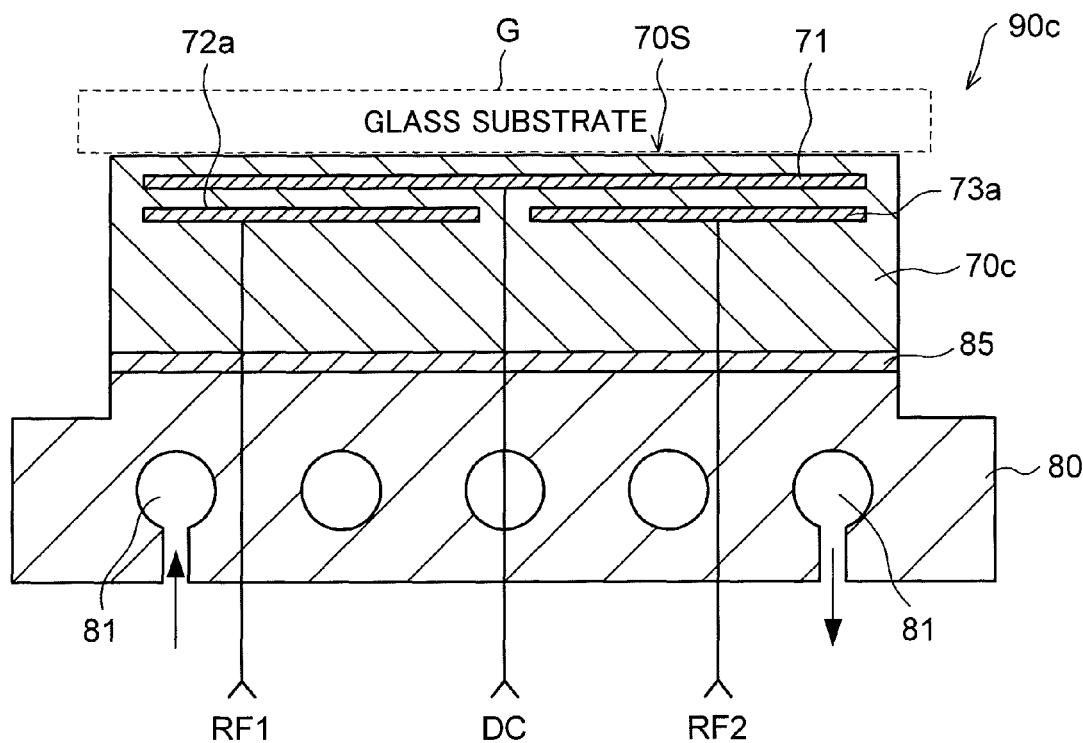
FIG. 9A is a vertical cross-sectional view illustrating the configuration of an electrostatic chuck according to a seventh embodiment.
Figure 9B:
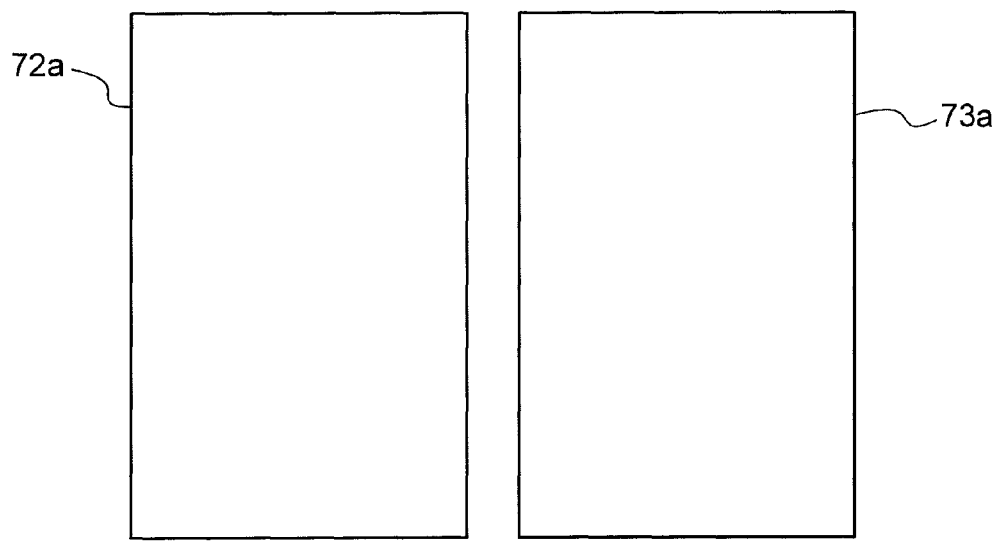
FIG. 9B is a plan view illustrating the arrangement of multiple RF electrode layers in FIG. 9A.

See FIGS. 9A and 9B

FIGS. 9A and 9B illustrate the configuration of an electrostatic chuck according to a seventh embodiment. Specifically, FIG. 9A illustrates a vertical cross-sectional structure of the electrostatic chuck, and FIG. 9B illustrates the arrangement of multiple RF electrode layers in FIG. 9A viewed in plane from the attraction surface side.

The configuration of an electrostatic chuck 90c according to the seventh embodiment (FIGS. 9A and 9B) is different from that of the electrostatic chuck 90 according to the fourth embodiment (FIGS. 6A and 6B) in the shape (in a plan view) of each of RF electrode layers 72a, 73a embedded in an inner portion (an insulating-layer portion) of an electrostatic chuck substrate. Other configurations are the same as those of the fourth embodiment, and are therefore not described here.

In the seventh embodiment, as is similar to the fourth embodiment, the attraction electrode layer 71 is formed in a rectangular at a position 0.5 mm away from the attraction surface 70S of the substrate 70c. Further, the RF electrode layer (RF1) 72a and the RF electrode layer (RF2) 73a to which radio-frequency powers of frequencies RF1 and RF2 are fed, respectively, are formed in rectangles at positions 0.3 to 0.5 mm away from the rectangular attraction electrode layer 71. In other words, as illustrated in FIG. 9A, the RF electrode layers 72a, 73a are formed on the same plane, and arranged separately from each other.

In the arrangement example of the present embodiment, as is similar to the arrangement example in the fourth embodiment, while a distance between the attraction surface 70S to which the glass substrate G is held and each of the RF electrode layers 72a, 73a is as extremely small as about 1 mm, a distance of as large as about 19 mm is secured for the thickness of a portion of the substrate 70c below the RF electrode layers 72a, 73a. In other words, the position of the adhesive layer 85 is set at a relatively low position.

In the configuration of the electrostatic chuck 90c according to the seventh embodiment, although the shape (in a plan view) of each of the RF electrode layers 72a, 73a embedded in the substrate 70c is different from that in the fourth embodiment, the basic configuration is the same as that of the fourth embodiment (FIGS. 6A and 6B). Accordingly, similar effects can be provided.

In the example illustrated in the seventh embodiment (FIGS. 9A and 9B), two RF electrode layers (72a, 73a) are arranged separately on the same plane in the substrate 70c. However, the number of separation is not limited to two, of course. For example, as illustrated as an example in FIGS. 8A and 8B, three RF electrode layers corresponding to respective three different frequencies (RF1, RF2, RF3) may be arranged on the same plane in the substrate 70c.

In addition, although the RF electrode layers 72a, 73a are arranged on the same plane in the substrate 70c in the example illustrated in the seventh embodiment, the RF electrode layers 72a, 73a do not necessarily have to be arranged on the same plane. For example, the RF electrode layers 72a, 73a may be arranged separately in different layers in such a manner as to partially overlap each other in a plan view.

All examples and conditional language recited herein are intended for pedagogical purposes to aid the reader in understanding of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate for an electrostatic chuck which has insulation quality and can be joined onto a metal base member, the substrate for an electrostatic chuck comprising:
   a first single, continuous electrode layer embedded in the substrate, close to an attraction surface which is an opposite side to a side to be joined to the base member; and
   a plurality of independent second electrode layers embedded in the substrate, at an opposite side to the single, continuous first electrode layer, the second electrode layers being divided and which electrically insulate each other,
   wherein an attraction direct current voltage is applied to the single, continuous first electrode layer, and different radio frequencies for plasma control are fed to the plurality of independent second electrode layers, respectively.

2. The substrate for electrostatic chuck according to claim 1, wherein the plurality of second electrode layers include an electrode layer arranged in a center portion in a plan view and at least one electrode layer arranged in a ring shape around the electrode layer in the center portion, and the electrode layers constituting the plurality of second electrode layers are arranged separately in different layers which are not on an identical plane.

3. The substrate for electrostatic chuck according to claim 2, wherein the electrode layers constituting the plurality of second electrode layers are arranged in such a manner as to partially overlap each other in a plan view.

4. The substrate for electrostatic chuck according to claim 1, wherein the plurality of second electrode layers include an electrode layer arranged in a center portion in a plan view and at least one electrode layer arranged in a ring shape around the electrode layer in the center portion, and the electrode layers constituting the plurality of second electrode layers are arranged separately on an identical plane.

5. The substrate for electrostatic chuck according to claim 1, wherein the electrode layers constituting the plurality of second electrode layers are each quadrangular in a plan view, and are arranged either separately on an identical plane, or separately in different layers which are not on an identical plane.

6. An electrostatic chuck comprising:
   a metal base member; and
   an insulating substrate having an attraction surface and an opposite surface to the attraction surface, the opposite surface being joined onto the base member via an adhesive layer, wherein the substrate includes:
   a first single, continuous electrode layer embedded in the substrate, close to the attraction surface; and
   a plurality of independent second electrode layers embedded in the substrate, at an opposite side to the single, continuous first electrode layer, wherein an attraction direct current voltage is applied to the single, continuous first electrode layer, and different radio frequencies for plasma control are fed to the plurality of independent second electrode layers, respectively.

7. The electrostatic chuck according to claim 6, wherein the plurality of second electrode layers include an electrode layer arranged in a center portion in a plan view and at least one electrode layer arranged in a ring shape around the electrode layer in the center portion, and the electrode layers constituting the plurality of second electrode layers are arranged separately in different layers which are not on an identical plane.

8. The electrostatic chuck according to claim 7, wherein the electrode layers constituting the plurality of second electrode layers are arranged in such a manner as to partially overlap each other in a plan view.

9. The electrostatic chuck according to claim 6, wherein the plurality of second electrode layers include an electrode layer arranged in a center portion in a plan view and at least one electrode layer arranged in a ring shape around the electrode layer in the center portion, and the electrode layers constituting the plurality of second electrode layers are arranged separately on an identical plane.

10. The electrostatic chuck according to claim 6, wherein the electrode layers constituting the plurality of second electrode layers are each quadrangular in a plan view, and are arranged either separately on an identical plane, or separately in different layers which are not on an identical plane.

* * * * *